US011789253B2

(12) United States Patent
Almeida Loya et al.

(10) Patent No.: US 11,789,253 B2
(45) Date of Patent: Oct. 17, 2023

(54) CAPACITANCE SENSING IN A MEMS MIRROR STRUCTURE

(71) Applicant: Beijing Voyager Technology Co., Ltd., Beijing (CN)

(72) Inventors: Sergio Fabian Almeida Loya, Mountain View, CA (US); Zuow-Zun Chen, Mountain View, CA (US); Qin Zhou, Livermore, CA (US); Youmin Wang, Mountain View, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 449 days.

(21) Appl. No.: 17/009,513

(22) Filed: Sep. 1, 2020

(65) Prior Publication Data
US 2022/0066197 A1   Mar. 3, 2022

(51) Int. Cl.
| | | |
|---|---|---|
| *G02B 26/08* | (2006.01) | |
| *G01R 27/26* | (2006.01) | |
| *G02B 26/10* | (2006.01) | |
| *G01S 17/931* | (2020.01) | |
| *G01S 7/481* | (2006.01) | |

(52) U.S. Cl.
CPC ..... *G02B 26/0841* (2013.01); *G01R 27/2605* (2013.01); *G01S 7/4817* (2013.01); *G01S 17/931* (2020.01); *G02B 26/101* (2013.01)

(58) Field of Classification Search
CPC ............ G02B 26/0833; G02B 26/0841; B81B 2201/042; B81B 2201/033
See application file for complete search history.

(56) References Cited

U.S. PATENT DOCUMENTS

| | | | | |
|---|---|---|---|---|
| 6,333,584 B1 * | 12/2001 | Jerman | ................. | H02N 1/008 |
| | | | | 310/309 |
| 6,625,341 B1 * | 9/2003 | Novotny | ................ | G02B 6/359 |
| | | | | 359/224.1 |
| 6,975,442 B2 * | 12/2005 | Gessner | ............ | G02B 26/0841 |
| | | | | 359/224.1 |
| 6,985,271 B2 * | 1/2006 | Yazdi | ................. | G02B 26/0841 |
| | | | | 359/291 |
| 8,039,922 B2 * | 10/2011 | Ni | ........................... | H01G 5/18 |
| | | | | 257/532 |

(Continued)

FOREIGN PATENT DOCUMENTS

| | | | | |
|---|---|---|---|---|
| CN | 205151756 U | * | 4/2016 | |
| CN | 110703430 A | * | 1/2020 | ......... G02B 26/0841 |

(Continued)

*Primary Examiner* — Christopher Stanford
(74) *Attorney, Agent, or Firm* — KILPATRICK TOWNSEND & STOCKTON LLP

(57) ABSTRACT

According to certain embodiments, a micro-electromechanical system (MEMS) apparatus has a MEMS mirror structure with a rotatable mirror. Rotation of the mirror produces a change in a measured capacitance corresponding to an angle of rotation. The MEMS structure sits on an oxide layer deposited on a substrate. There is a parasitic capacitance between the MEMS mirror structure and the substrate. An added capacitance is provided between the substrate and a DC voltage source. The added capacitance is much larger than the parasitic capacitance, and shunts the parasitic capacitance to ground to minimize its effect on the measured capacitance.

17 Claims, 14 Drawing Sheets

(56) References Cited

U.S. PATENT DOCUMENTS

| | | | |
|---|---|---|---|
| 9,910,267 B2* | 3/2018 | Hofmann | G02B 26/101 |
| 10,514,446 B1* | 12/2019 | Wang | G01S 17/931 |
| 11,555,998 B2* | 1/2023 | Almeida | G01S 17/10 |
| 2001/0048265 A1 | 12/2001 | Miller et al. | |
| 2002/0005976 A1* | 1/2002 | Behin | B81C 1/0015 |
| | | | 359/254 |
| 2002/0008922 A1* | 1/2002 | Conant | B81C 1/00658 |
| | | | 359/871 |
| 2002/0171327 A1 | 11/2002 | Miller et al. | |
| 2003/0183008 A1* | 10/2003 | Bang | B33Y 10/00 |
| | | | 73/514.01 |
| 2018/0188656 A1* | 7/2018 | Bihr | G01D 5/24 |
| 2019/0113790 A1 | 4/2019 | Hakoi et al. | |
| 2022/0324698 A1* | 10/2022 | Loya | B81C 1/00317 |

FOREIGN PATENT DOCUMENTS

| | | | | |
|---|---|---|---|---|
| CN | 111204701 A | * | 5/2020 | |
| CN | 111348618 A | * | 6/2020 | |
| WO | WO-03050852 A2 | * | 6/2003 | A61F 2/91 |

* cited by examiner

CAPACITANCE SENSING IN A MEMS MIRROR STRUCTURE

BACKGROUND OF THE INVENTION

Modern vehicles are often equipped with sensors designed to detect objects and landscape features around the vehicle in real-time to enable technologies such as lane change assistance, collision avoidance, and autonomous driving. Some commonly used sensors include image sensors (e.g., infrared or visible light cameras), acoustic sensors (e.g., ultrasonic parking sensors), radio detection and ranging (RADAR) sensors, magnetometers (e.g., passive sensing of large ferrous objects, such as trucks, cars, or rail cars), and light detection and ranging (LiDAR) sensors.

A LiDAR system typically uses a light source and a light detection system to estimate distances to environmental features (e.g., pedestrians, vehicles, structures, plants, etc.). For example, a LiDAR system may transmit a light beam (e.g., a pulsed laser beam) to illuminate a target and then measure the time it takes for the transmitted light beam to arrive at the target and then return to a receiver near the transmitter or at a known location. In some LiDAR systems, the light beam emitted by the light source may be steered across a two-dimensional or three-dimensional region of interest according to a scanning pattern, to generate a "point cloud" that includes a collection of data points corresponding to target points in the region of interest. The data points in the point cloud may be dynamically and continuously updated, and may be used to estimate, for example, a distance, dimension, location, and speed of an object relative to the LiDAR system.

Light steering typically involves the projection of light in a pre-determined direction to facilitate, for example, the detection and ranging of an object, the illumination and scanning of an object, or the like. Light steering can be used in many different fields of applications including, for example, autonomous vehicles, medical diagnostic devices, etc., and can be configured to perform both transmission and reception of light. For example, a light steering transmitter may include a micro-mirror to control the projection direction of light to detect/image an object. Moreover, a light steering receiver may also include a micro-mirror to select a direction of incident light to be detected by the receiver, to avoid detecting other unwanted signals. A micro-mirror assembly typically includes a micro-mirror and an actuator. In a micro-mirror assembly, a mirror-mirror can be connected to a substrate via a connection structure (e.g., a torsion bar, a spring, etc.) to form a pivot point. One such type of micro-mirror assembly can be a micro-electro-mechanical system (MEMS)-type structure that may be used for a light detection and ranging (LiDAR) system in an autonomous vehicle, which can be configured for detecting objections and determining their corresponding distances from the vehicle. LiDAR systems typically work by illuminating a target with an optical pulse and measuring the characteristics of the reflected return signal. The return signal is typically captured as a point cloud. The width of the optical-pulse often ranges from a few nanoseconds to several microseconds.

A typical electrostatic MEMS mirror involves a spring, a mirror mass, and comb fingers. The mirror mass is suspended by mechanical springs which are typically anchored in an SiO$_2$/silicon substrate and it moves when a driving voltage (V) is applied across the comb fingers. Since the overlap area in the fingers changes along with the mirror mass displacement, the capacitance of the comb fingers changes ($\chi_{BC}$) proportionally and it is used as feedback to control the motion of the mirror mass. However, the capacitance measurement accuracy is hindered by parasitic capacitances. The most significant parasitic capacitance is observed across the substrate. This capacitance is coupled in parallel with the fingers capacitance limiting the sensitivity of the sensed voltage ($\Delta V_{sensed}$). When the parasitic capacitance is large or low impedance ($\chi$), the change in the fingers capacitance has minimum effect on the sensed voltage, i.e., $$\frac{\delta V_{sensed}}{\delta \chi_{BC}}$$

is small when $\chi_{BS}+\chi_{CS} \ll \chi_{BC}$. Therefore, to increase sensitivity, the parasitic capacitance needs to be as small as possible. However, the substrate is a fundamental component in the MEMS mirrors and electrical decoupling is extremely difficult and/or almost impossible.

BRIEF SUMMARY OF THE INVENTION

Techniques disclosed herein relate generally to microelectromechanical (MEMS) mirrors that can be used in, for example, light detection and ranging (LiDAR) systems or other light beam steering systems. More specifically, and without limitation, disclosed herein are MEMS micro-mirrors including a mirror mass that tilts and produces a change in capacitance that can be measured. The capacitance change is proportional to the angle of tilt of the mirror, and thus provides a feedback signal to indicate the angle of the mirror. However, measurement errors can be caused by parasitic capacitance. Various inventive embodiments to minimize the effect of the parasitic capacitance are described herein, including systems, modules, devices, components, circuits, materials, methods, and the like.

According to certain embodiments, a micro-electromechanical system (MEMS) apparatus has a MEMS mirror structure with a rotatable mirror. Rotation of the mirror produces a change in a measured capacitance corresponding to an angle of rotation. The MEMS structure sits on an oxide layer deposited/grown on a substrate. There is a parasitic capacitance between the MEMS mirror structure and the substrate. An added capacitance is provided between the substrate and a DC/AC voltage source. The added capacitance is much larger than the parasitic capacitance, and shunts the parasitic capacitance to ground to minimize its effect on the measured capacitance.

According to certain embodiments, the large added capacitance provides a low impedance element to improve the sensed voltage sensitivity and noise reduction. The added capacitance ($C_{add}$) is integrated around the MEMS mirror and/or added to the bottom of the substrate with an additional oxide layer.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

In one embodiment, a micro-electromechanical system (MEMS) apparatus for beam steering in a Light Detection and Ranging (LiDAR) system of an autonomous vehicle is provided. The apparatus has a mirror mass 304 having a reflective surface 305. There are first and second supporting springs 302 connected to the mirror mass 304 on opposite sides to support the mirror mass. First and second common terminals 310 are connected to the first and second supporting springs 302. A number of first fingers 306 extend from the mirror mass on first and second sides orthogonal to the first and second supporting springs 302. There are first and second bias terminals 314 opposite the first and second sides of the mirror mass 304 A group of second fingers 312 extend from the first and second bias terminals. The second fingers are interleaved with the first fingers and partially overlap the first fingers. An oxide layer 320 is below the first and second common terminals and the first and second bias terminals. A substrate 322 is below the oxide layer. There is a sensed capacitance ($C_{BC}$) between the common terminals (C) and the anchor and bias terminals (B). The sensed capacitance ($C_{BC}$) is proportional to the total overlap between the first fingers and the second fingers. There is also a first parasitic capacitance ($C_{CS}$) between the common terminals and the substrate and a second parasitic capacitance ($C_{BS}$) between the bias terminals and the substrate. An added capacitance $C_{add}$ is provided between the substrate 322 and a voltage source 606. The added capacitance is many times larger than the first and second parasitic capacitance combined.

In one embodiment the added capacitance is a structure 602 outside the first and second common terminals and the first and second bias terminals, in the same layer as the first and second common terminals and the first and second bias terminals. In one embodiment, the structure is a rectangular ring 602 enclosing both the first and second common terminals and the first and second bias terminals.

In one embodiment, the added capacitance is a second oxide layer 702 on an opposite side of the substrate 322 from the first oxide layer 320. A conductor layer 704 is on a side of the second oxide layer 702 opposite the substrate 322. A connection to ground 706 is coupled to the conductor layer 704.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

The features of the various embodiments described above, as well as other features and advantages of certain embodiments of the present invention will, be more apparent from the following detailed description taken in conjunction with the accompanying drawings, in which.

DETAILED DESCRIPTION OF THE INVENTION

Figure 1:
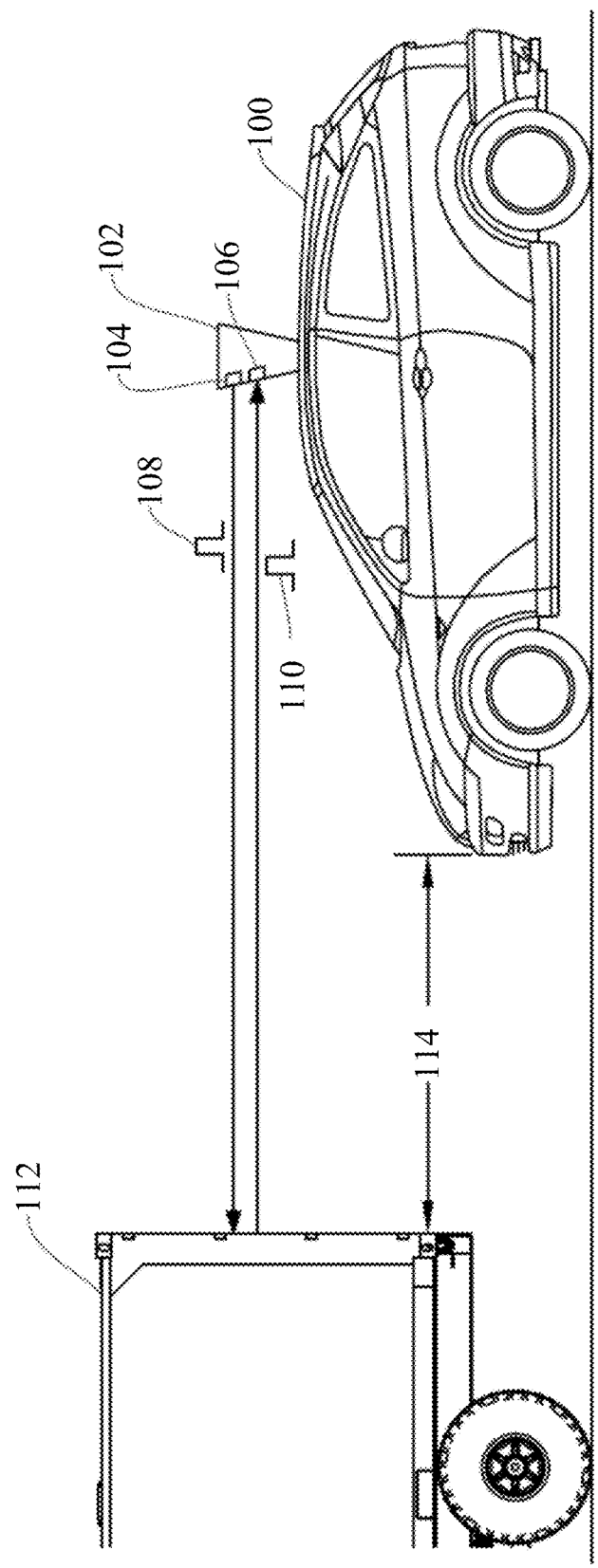
FIG. 1 shows an autonomous vehicle with a LiDAR system, according to certain embodiments.

Aspects of the present disclosure relate generally to a LiDAR system, and more particularly to reducing the parasitic capacitance of MEMS micro-mirror devices, according to certain embodiments.

In the following description, various examples of MEMS-based micro mirror structures are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

The following high level summary is intended to provide a basic understanding of some of the novel innovations depicted in the figures and presented in the corresponding descriptions provided below. Techniques disclosed herein relate generally to microelectromechanical (MEMS) mirrors that can be used in, for example, light detection and ranging (LiDAR) systems or other light beam steering systems. More specifically, and without limitation, disclosed herein are MEMS micro-mirrors including a mirror mass 304 shown in FIG. 6, for example, that tilts and produces a change in capacitance proportional to the change in overlapping areas which is proportional to the angle of tilt. Thus, by measuring the change in capacitance, the angle of tilt can be measured. The capacitance change is proportional to the angle of tilt of the mirror, and thus provides a feedback signal to indicate the angle of the mirror. However, measurement errors can be caused by parasitic capacitance between the mirror structures and the substrate. Various inventive embodiments to minimize the effect of the parasitic capacitance are described herein.

According to certain embodiments, a micro-electromechanical system (MEMS) apparatus has a MEMS mirror structure with a rotatable mirror. Rotation of the mirror produces a change in a measured capacitance corresponding to an angle of rotation. The MEMS structure sits on an oxide layer deposited on a substrate. There is a parasitic capacitance between the MEMS mirror structure and the substrate. An added capacitance is provided between the substrate and a DC voltage source. The added capacitance is much larger than the parasitic capacitance (e.g., 10 to 100 times larger), and shunts the parasitic capacitance to ground to minimize its effect on the measured capacitance.

In one embodiment, the MEMS mirror structure has fingers that extend from the mirror mass, and are interleaved with fingers from a bias terminal. It is the capacitance between the fingers that is measured to determine how far the mirror has tilted. The mirror is tilted to reflect a light beam, and tilts rapidly in different directions to scan an area. The tilting is accomplished by a voltage applied across a COM (common) terminal connected to the mirror mass and the bias terminal. The different amounts of tilt cause the fingers to separate by different angles, changing the area of overlap between the fingers, and thus changing the capacitance between the fingers.

Figure 6:
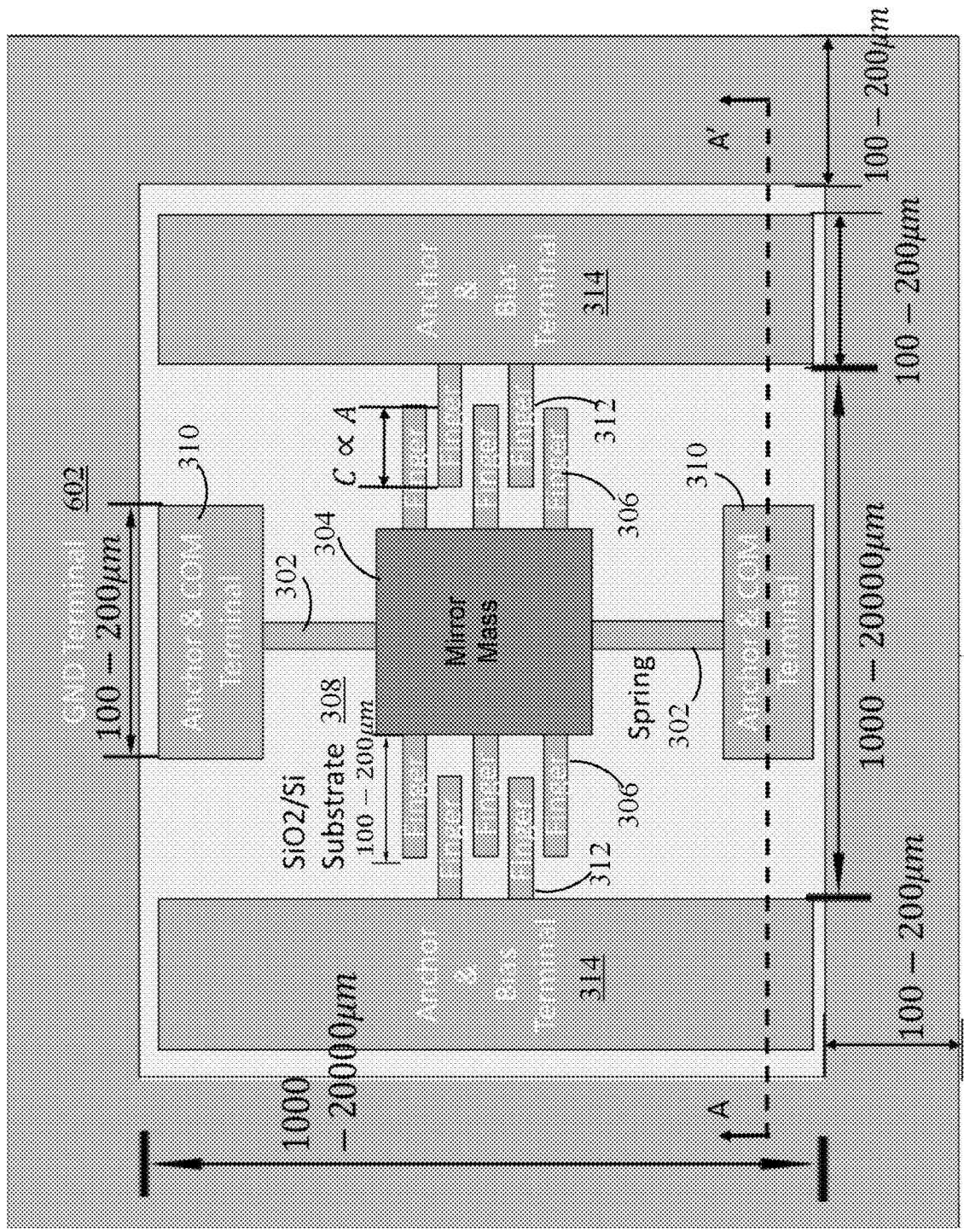
FIG. 6 is a diagram of a first embodiment of a MEMS mirror with a parasitic capacitance reduction ring structure, according to certain embodiments.
Figure 9:
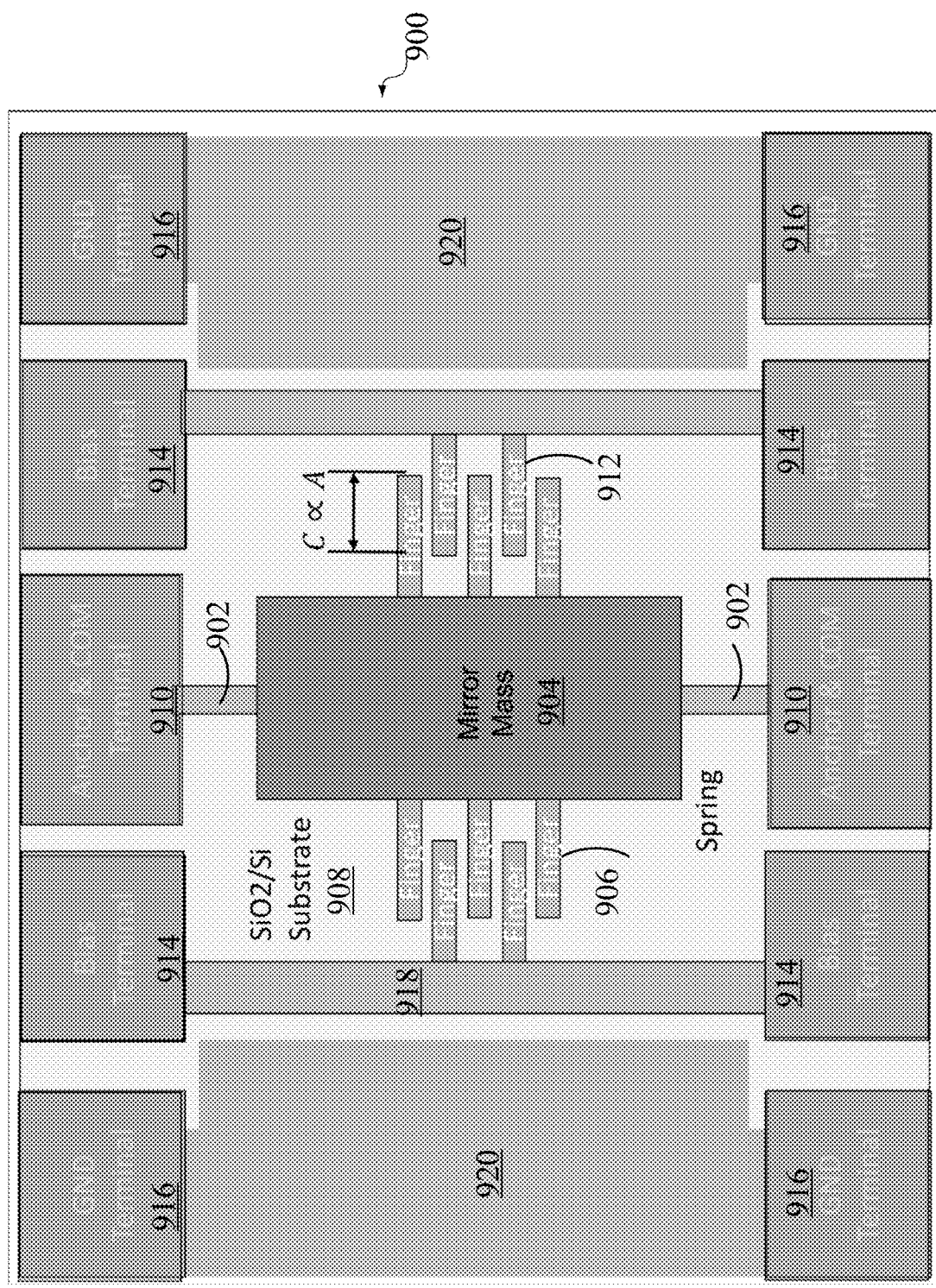
FIG. 9 is a diagram of a third embodiment of a MEMS mirror with a parasitic capacitance reduction parallel bar structure, according to certain embodiments.

According to certain embodiments, the large added capacitance provides a low impedance element to improve the sensed voltage sensitivity and noise reduction. In the embodiment of FIGS. 6-7, the added capacitance ($C_{add}$) is integrated around the MEMS mirror with a ring-like structure. Alternate structures to a ring may be used, with the added capacitance proximate to the mirror structure. For example, instead of a continuous ring around the MEMS mirror structure, a series of capacitive areas can be used. In the embodiment of FIG. 9, the added capacitance ($C_{add}$) is provided with two areas, resembling bars, on either side of the MEMS mirror structure, but not above or below. This reduces the overall footprint of the chip structure. Alternate geometries may be used to maximize the added capacitance, while keeping the device footprint from becoming too large.

Figure 8:
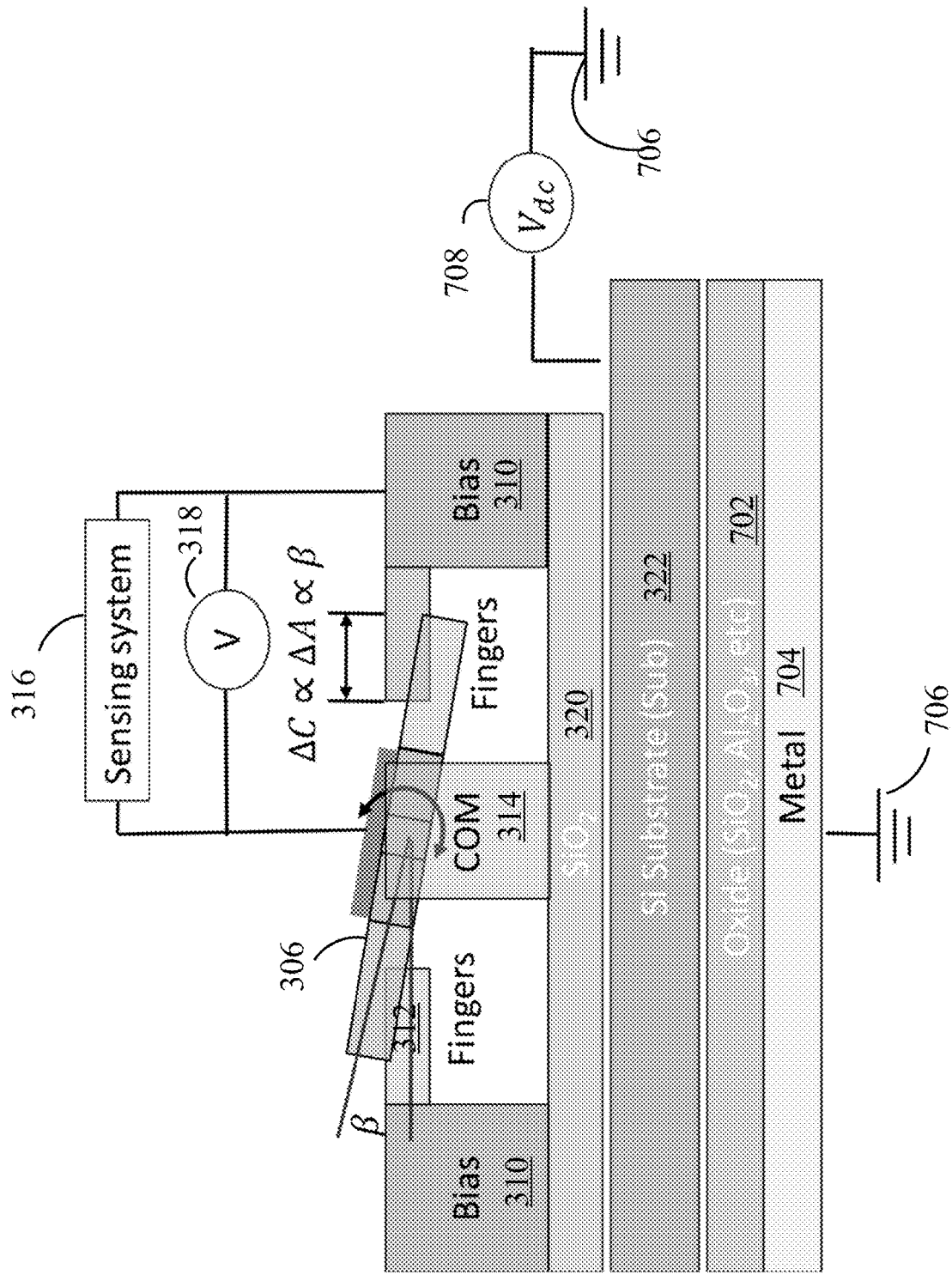
FIG. 8 is a sectional diagram of a second embodiment of a MEMS mirror with a parasitic capacitance reduction substrate structure, according to certain embodiments.

In the embodiment of FIG. 8, the added capacitance ($C_{add}$) is added to the bottom of the substrate with an additional oxide layer 702. On the bottom of the added oxide layer, a metal or other conductive layer 704 is added. The metal can be aluminum or another metal or metallic compound. Alternately, mostly conductive materials could be used, such as a silicide. This provides a capacitor with the added oxide layer being the dielectric and the substrate and the metal layer being the two terminals of the capacitor. The metal layer is connected to a DC voltage, or ground, to shunt the parasitic capacitance away from the sensing node for the measured capacitance.

Generally, aspects of the invention are directed to implementations of light steering, which can be used in a number of different applications. For example, a Light Detection and Ranging (LiDAR) module of an autonomous vehicle may incorporate a light steering system. The light steering system can include a transmitter and receiver system to steer emitted incident light in different directions around a vehicle, and to receive reflected light off of objects around the vehicle using a sequential scanning process, which can be used to determine distances between the objects and the vehicle to facilitate autonomous navigation.

Light steering can be implemented by way of one or more micro-mirror assemblies (e.g., often part of an array), with each micro-mirror assembly having a movable micro-mirror and an actuator (or multiple actuators). The micro-mirrors and actuators can be formed as microelectromechanical systems (MEMS) on a semiconductor substrate, which allows for the integration of the MEMS with other circuitries (e.g., controller, interface circuits, etc.) on the semiconductor substrate, which can allow for simpler, easier, more robust, and cost-effective manufacturing processes.

In a micro-mirror assembly, a micro-mirror can be mechanically connected (e.g., "anchored") to the semiconductor substrate via a connection structure (e.g., torsion bar, torsion spring, torsion beam, etc.) to form a pivot point and an axis of rotation. As described herein, "mechanically connected," or "connected," can include a direct connection or an indirect connection. For example, the micro-mirror can be indirectly connected to the substrate via a connection structure (e.g., torsion bar or torsion spring) to form a pivot/connection point. The micro-mirror can be rotated around the pivot/connection point ("referred to herein as a pivot point") on the axis of rotation by an actuator. In the embodiments presented herein an electrostatic actuator is typically used; however, any suitable type of actuator may be implemented (e.g., piezoelectric, thermal mechanical, etc.), and one of ordinary skill in the art with the benefit of this disclosure would appreciate the many modifications, combinations, variations, and alternative embodiments thereof.

In some embodiments, each micro-mirror can be configured to be rotated by a rotation angle to reflect (and steer) light towards a target direction. The connection structure can be deformed to accommodate the rotation, but the connection structure also has a degree of spring stiffness, which varies with the rotation angle and counters the rotation of the micro-mirror to set a target rotation angle. To rotate a micro-mirror by a target rotation angle, an actuator can apply a torque to the micro-mirror based on the rotational moment of inertia of the mirror, as well as the degree of spring stiffness for a given target rotation angle. Different torques can be applied to rotate (e.g., oscillate) the micro-mirror at or near a resonant frequency to achieve different target rotation angles. The actuator can then remove the torque, and the connection structure can return the micro-mirror back to its default orientation for the next rotation. The rotation of the micro-mirror can be repeated in the form of an oscillation, typically at or near a resonant frequency of the micro-mirror based on the mass of the micro-mirror and the spring constant of the connection structure (e.g., shown as a torsion bar throughout the figures of this disclosure). In the various embodiments described throughout this disclosure, references to rotating a micro-mirror "at or near" a resonant frequency can mean within a particular range of the resonant frequency. For instance, "at or near" a resonant frequency may mean within +/−5% of the resonant frequency, although other tolerances are possible (e.g., +1-1%, +1-2%, +/−3%, +/−10%, etc.), as would be appreciated by one of ordinary skill in the art with the benefit of this disclosure. Other terms that can mean "at or near" in the manner described above include "approximately," "substantially," or the like. In some embodiments, connection structures may be configured on opposite and diametrically opposed sides of a mirror or gimbal.

In certain embodiments, each micro-mirror can be configured to receive an incident light beam at a common rotation angle with the other micro-mirrors in the array to collectively steer the incident light beam at a target direction (e.g., in front of the vehicle). In some embodiments, each micro-mirror can be rotated around two orthogonal axes to provide a first range of angles of projection along a vertical dimension and to provide a second range of angles of projection along a horizontal dimension. The first range and the second range of angles of projection can define a two-dimensional field of view (FOV) in which light is projected to detect/scan an object. The FOV can also define a two-dimensional range of directions of incident lights that can be reflected by the object and detected by the receiver. Less commonly, LiDAR systems may also operate over a single axis (e.g., along a horizontal direction). One of ordinary skill in the art with the benefit of this disclosure would appreciate the many implementations and alternative embodiments thereof.

Typical System Environment for Certain Embodiments of the Invention

FIG. 1 illustrates an autonomous vehicle 100 in which the various embodiments described herein can be implemented. Autonomous vehicle 100 can include a LiDAR module 102. LiDAR module 102 allows autonomous vehicle 100 to perform object detection and ranging in a surrounding environment. Based on the result of object detection and ranging, autonomous vehicle 100 can drive according to the rules of the road and maneuver to avoid a collision with detected objects. LiDAR module 102 can include a light steering transmitter 104 and a receiver 106. Light steering transmitter 104 can project one or more light signals 108 at various directions (e.g., incident angles) at different times in any suitable scanning pattern, while receiver 106 can monitor for a light signal 110 which is generated by the reflection of light signal 108 by an object. Light signals 108 and 110 may include, for example, a light pulse, a frequency modulated continuous wave (FMCW) signal, an amplitude modulated continuous wave (AMCW) signal, etc. LiDAR module 102 can detect the object based on the reception of light signal 110, and can perform a ranging determination (e.g., a distance of the object) based on a time difference between light signals 108 and 110, as would be appreciated by one of ordinary skill in the art with the benefit of this disclosure. For example, as shown in FIG. 1, LiDAR module 102 can transmit light signal 108 at a direction directly in front of autonomous vehicle 100 at time T1 and receive light signal 110 reflected by an object 112 (e.g., another vehicle) at time T2. Based on the reception of light signal 110, LiDAR module 102 can determine that object 112 is directly in front of autonomous vehicle 100. Moreover, based on the time difference between T1 and T2, LiDAR module 102 can also determine a distance 114 between autonomous vehicle 100 and object 112. Autonomous vehicle 100 can thereby adjust its speed (e.g., slowing or stopping) to avoid collision with object 112 based on the detection and ranging of object 112 by LiDAR module 102.

Figure 2A:
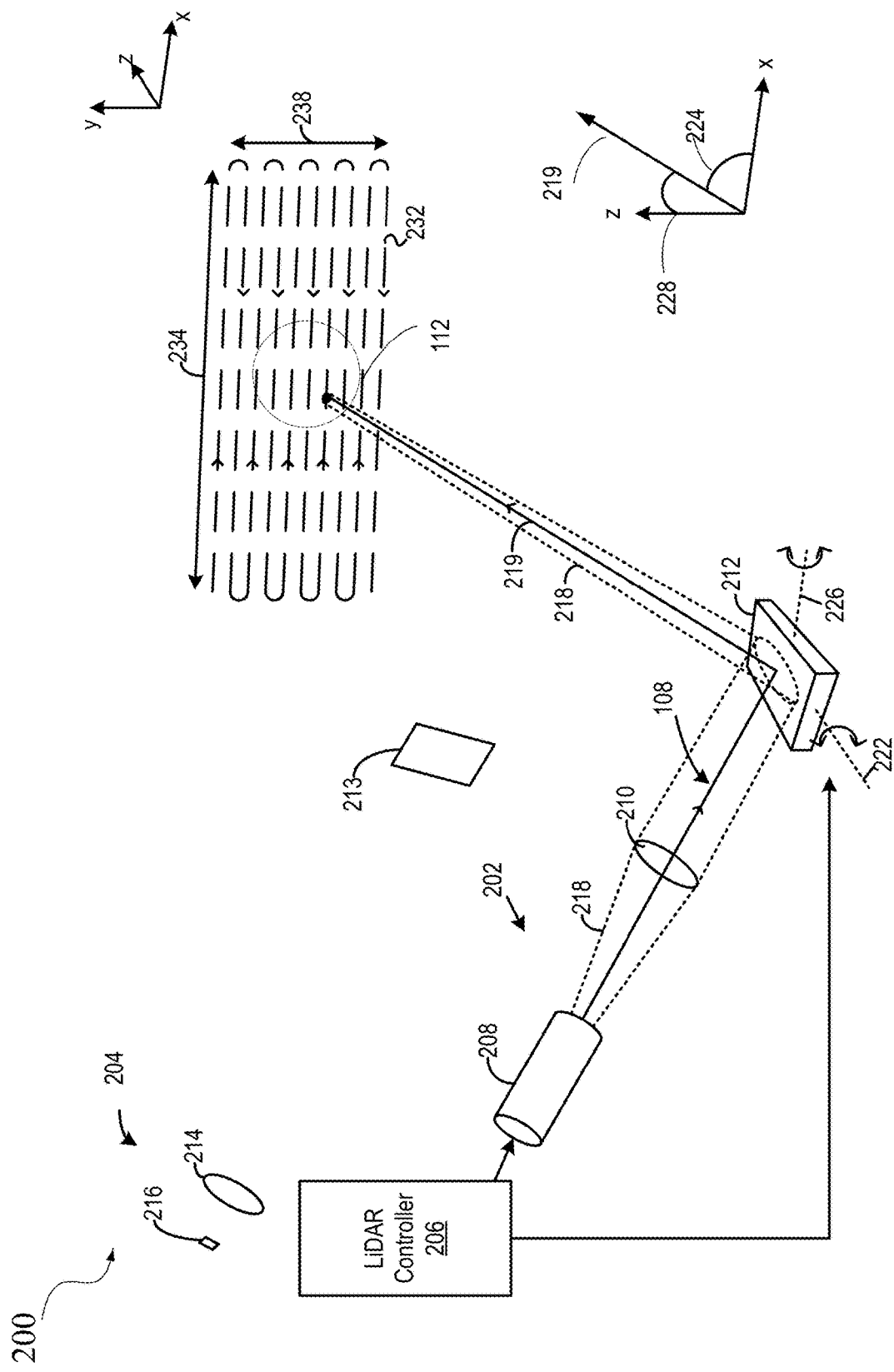
FIG. 2A shows an example of a light projection operation, according to certain embodiments.
Figure 2B:
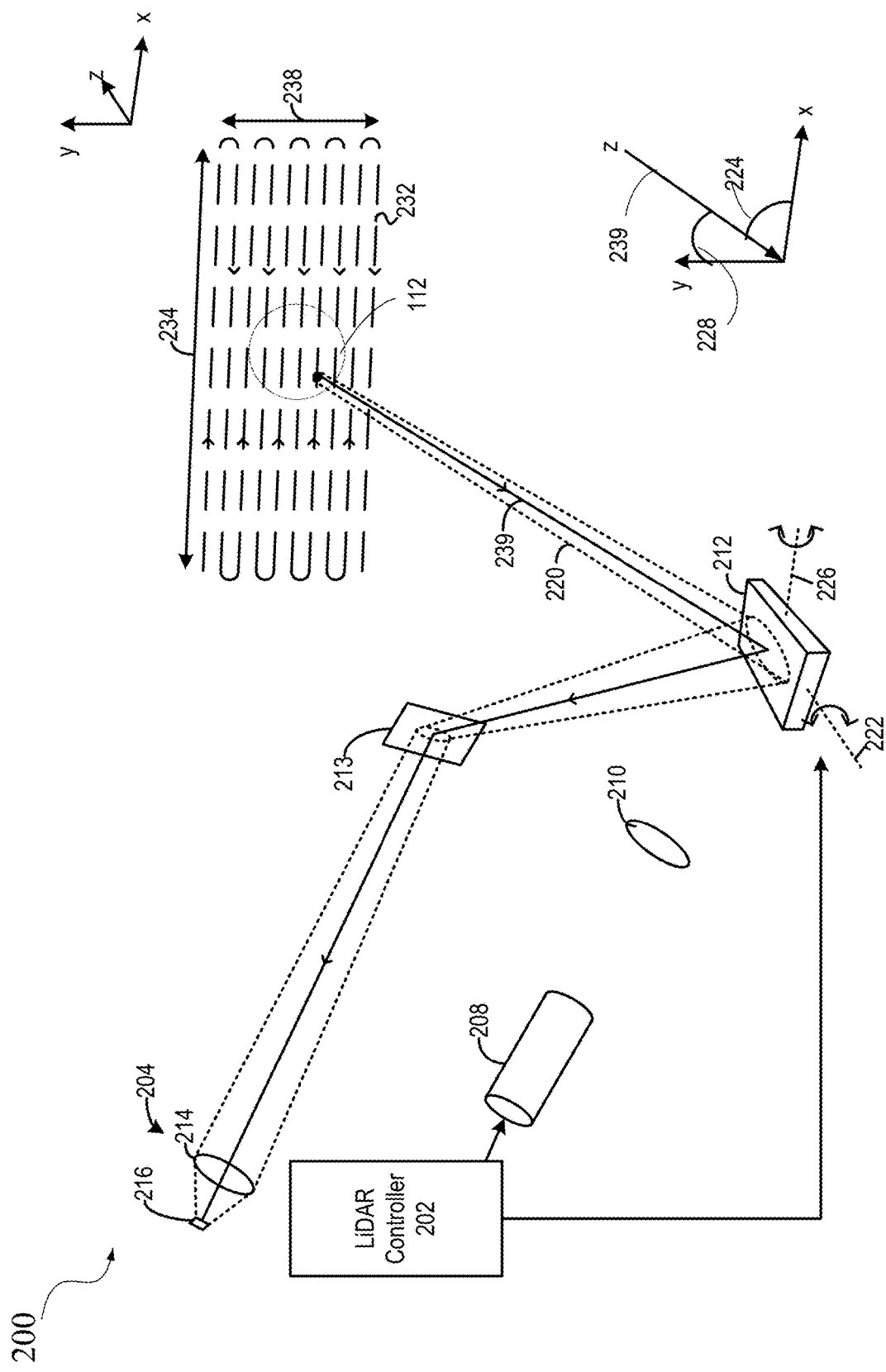
FIG. 2B shows an example of a light detection operation, according to certain embodiments.

FIG. 2A and FIG. 2B illustrate simplified block diagrams of an example of a LiDAR module 200 according to certain embodiments. LiDAR module 200 may be an example of LiDAR system 102, and may include a transmitter 202, a receiver 204, and LiDAR controller 206, which may be configured to control the operations of transmitter 202 and receiver 204. Transmitter 202 may include a light source 208 and a collimator lens 210, and receiver 204 can include a lens 214 and a photodetector 216. LiDAR module 200 may further include a mirror assembly 212 (also referred to as a "mirror structure") and a beam splitter 213. In some embodiments, LiDAR module 102, transmitter 202 and receiver 204 can be configured as a coaxial system to share mirror assembly 212 to perform light steering operations, with beam splitter 213 configured to reflect incident light reflected by mirror assembly 212 to receiver 204.

FIG. 2A shows an example of a light projection operation, according to certain embodiments. To project light, LiDAR controller 206 can control light source 208 (e.g., a pulsed laser diode, a source of FMCW signal, AMCW signal, etc.) to transmit light signal 108 as part of light beam 218. Light beam 218 can disperse upon leaving light source 208 and can be converted into collimated light beam 218 by collimator lens 210. Collimated light beam 218 can be incident upon a mirror assembly 212, which can reflect collimated light beam 218 to steer it along an output projection path 219 towards object 112. Mirror assembly 212 can include one or more rotatable mirrors. FIG. 2A illustrates mirror assembly 212 as having one mirror; however, a micro-mirror array may include multiple micro-mirror assemblies that can collectively provide the steering capability described herein. Mirror assembly 212 can further include one or more actuators (not shown in FIG. 2A) to rotate the rotatable mirrors. The actuators can rotate the rotatable mirrors around a first axis 222, and can rotate the rotatable mirrors along a second axis 226. The rotation around first axis 222 can change a first angle 224 of output projection path 219 with respect to a first dimension (e.g., the x-axis), whereas the rotation around second axis 226 can change a second angle 228 of output projection path 219 with respect to a second dimension (e.g., the z-axis). LiDAR controller 206 can control the actuators to produce different combinations of angles of rotation around first axis 222 and second axis 226 such that the movement of output projection path 219 can follow a scanning pattern 232. A range 234 of movement of output projection path 219 along the x-axis, as well as a range 238 of movement of output projection path 219 along the z-axis, can define a FOV. An object within the FOV, such as object 112, can receive and reflect collimated light beam 218 to form reflected light signal, which can be received by receiver 204 and detected by the LiDAR module, as further described below with respect to FIG. 2B. In certain embodiments, mirror assembly 212 can include one or more comb spines with comb electrodes (see, e.g., FIG. 3), as will be described in further detail below.

FIG. 2B shows an example of a light detection operation, according to certain embodiments. LiDAR controller 206 can select an incident light direction 239 for detection of incident light by receiver 204. The selection can be based on setting the angles of rotation of the rotatable mirrors of mirror assembly 212, such that only light beam 220 propagating along light direction 239 gets reflected to beam splitter 213, which can then divert light beam 220 to photodetector 216 via collimator lens 214. With such arrangements, receiver 204 can selectively receive signals that are relevant for the ranging/imaging of object 112 (or any other object within the FOV), such as light signal 110 generated by the reflection of collimated light beam 218 by object 112, and not to receive other signals. As a result, the effect of environmental disturbance on the ranging and imaging of the object can be reduced, and the system performance may be improved.

Parasitic Capacitance in Typical MEMS Mirror Structure

Figure 3:
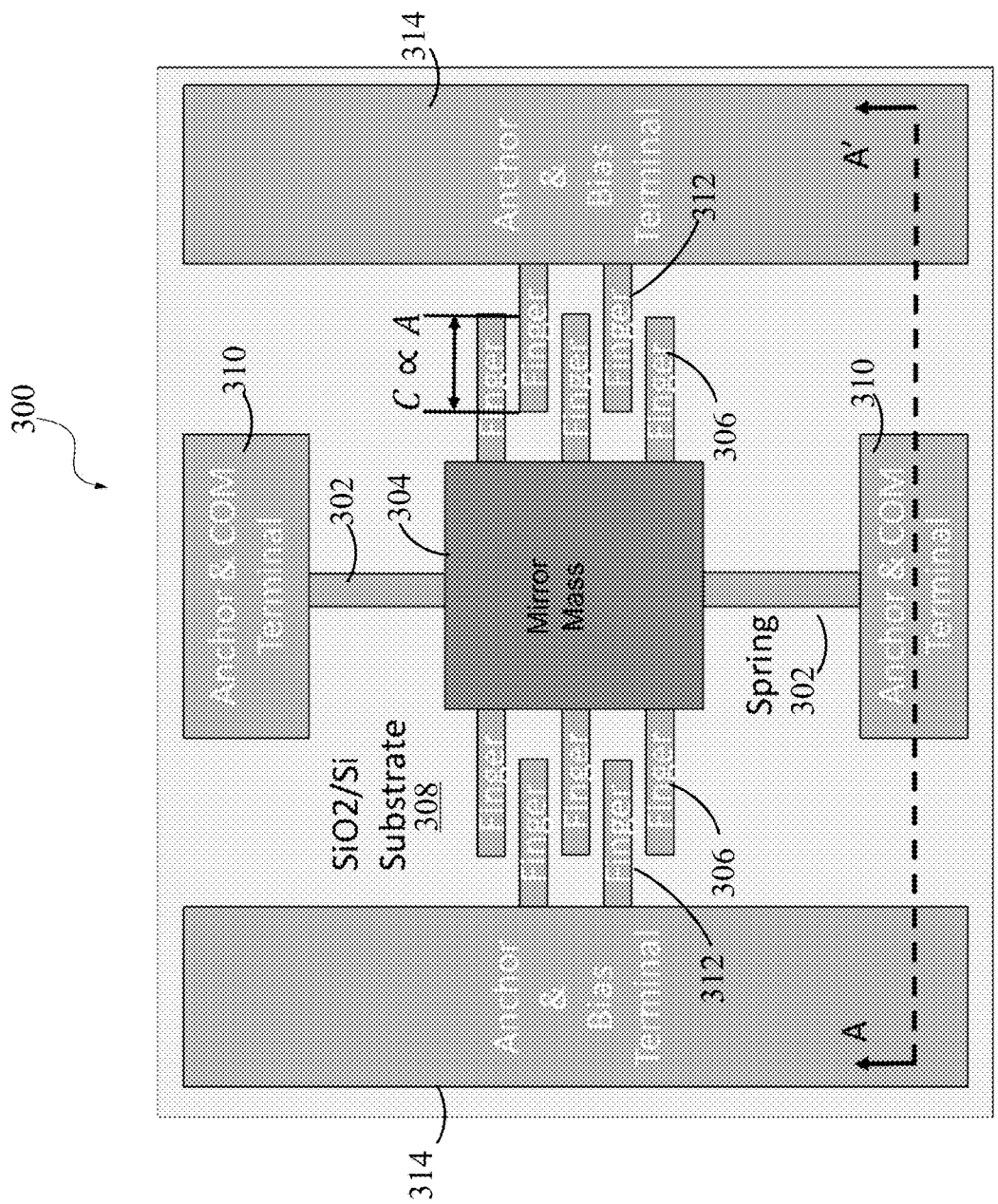
FIG. 3 is a diagram of the structure of a prior art MEMS mirror with parasitic capacitance.

FIG. 3 is a diagram of the structure of a prior art MEMS mirror with parasitic capacitance. FIG. 3 shows a typical electrostatic MEMS mirror structure 300 with springs 302, a mirror mass 304, and comb fingers 306, 312. The mirror mass 304 is suspended by mechanical springs 302 which are typically anchored in a $SiO_2$/silicon substrate 308 and anchored at anchor and COM (sometimes referred to as simply "common" or "COM") terminals 310. Comb fingers 306 are connected to mirror mass 304, and are interleaved with comb fingers 312 connected to anchor and bias (sometimes referred to as simply "bias") terminals 314. Terminals 310 provide for common (COM) with the mirror, both providing a driving voltage and sensing a change in capacitance between the fingers 306 connected to mirror mass 304, and interleaved fingers 312 connected to anchor and bias terminals 314. Anchor and bias terminals 314 are connected to a voltage bias, which is typically an AC voltage.

As shown, this structure allows rotation around the axis of the springs 302. In another embodiment not shown in order to not complicate the diagram, additional springs can be provided to give a second, orthogonal axis of rotation of the mirror mass 304. Additional interleaved comb fingers are then provided, connected to separate bias and COM anchor terminals.

There are other variables in the fingers that can help with the capacitance under measure (without impacting the parasitic capacitance). For example, changes in the thickness, which also affects the spring as they are made with the same Si film. There are several tradeoffs, but in general higher capacitance is desired. A bigger area overlap (larger fingers and smaller gap between them) gives bigger capacitance and actuation force but it also reduces the quality factor due to the air friction between them (damping). The fingers gap is also limited by fabrication; an achievable aspect ratio (device thickness over feature size) is around 20. Higher capacitance is easier to measure and provides larger forces but it is limited by fabrication and reduces the quality factor. Optimizing these tradeoffs, the fingers capacitance is still not much larger than the parasitic capacitance (as the SiO2 thickness is around 2 um and has a relative permittivity of 4, while air is 1).

Figure 4:
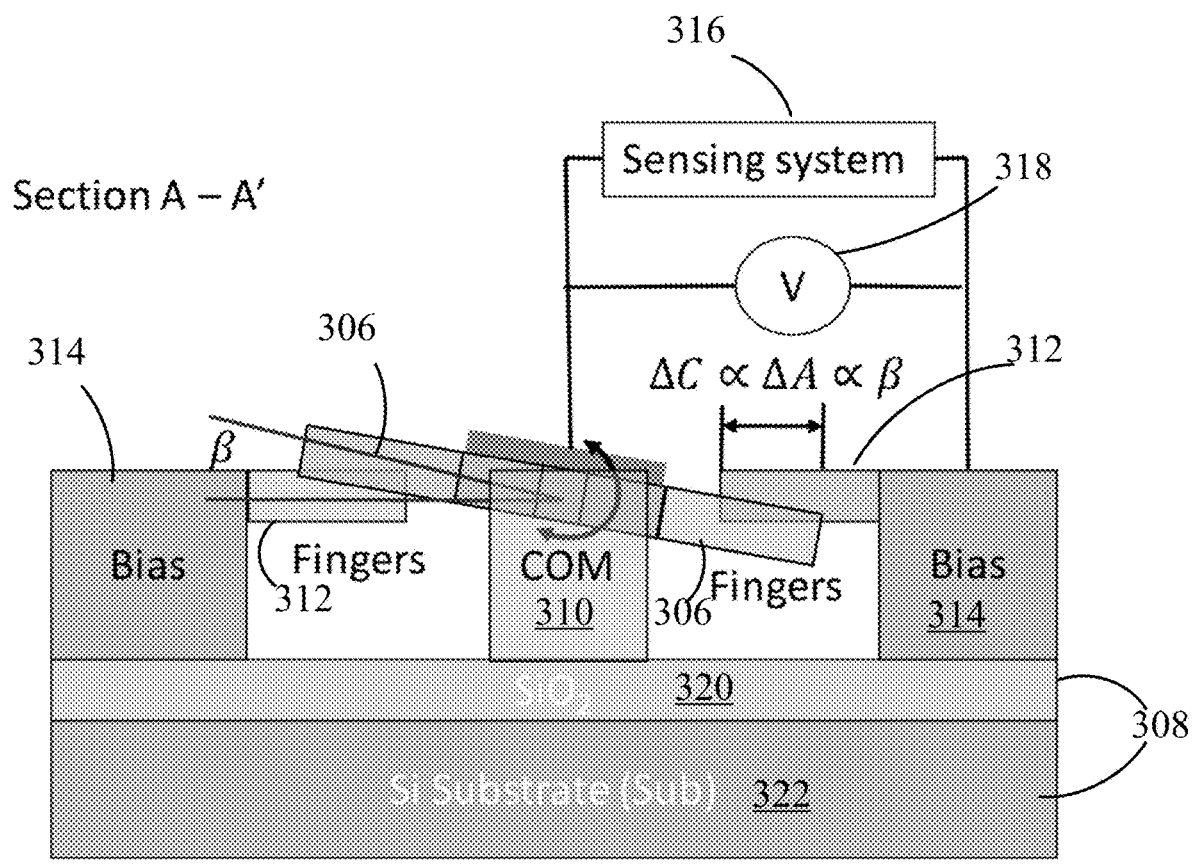
FIG. 4 is a sectional view of FIG. 3 along lines A-A.

FIG. 4 is a sectional view of FIG. 3 along lines A-A. As can be seen from FIG. 4, mirror mass 304 tilts when a driving voltage 318 (V) is applied across the comb fingers 306, 312, between COM terminal 310 and bias terminal 314. Since the overlap area in the fingers changes along with the mirror mass displacement, the capacitance of the comb fingers changes proportionally and it is sensed by sensing system 316 and used as feedback to control the motion of the mirror mass. As shown, the overlap between the fingers 306 and 312 changes, with a change in capacitance ($\Delta C$) that is proportional to the change in overlap area ($\Delta A$), which is proportional to the tilt angle $\beta$. However, the capacitance measurement accuracy is hindered by parasitic capacitances.

Figure 5:
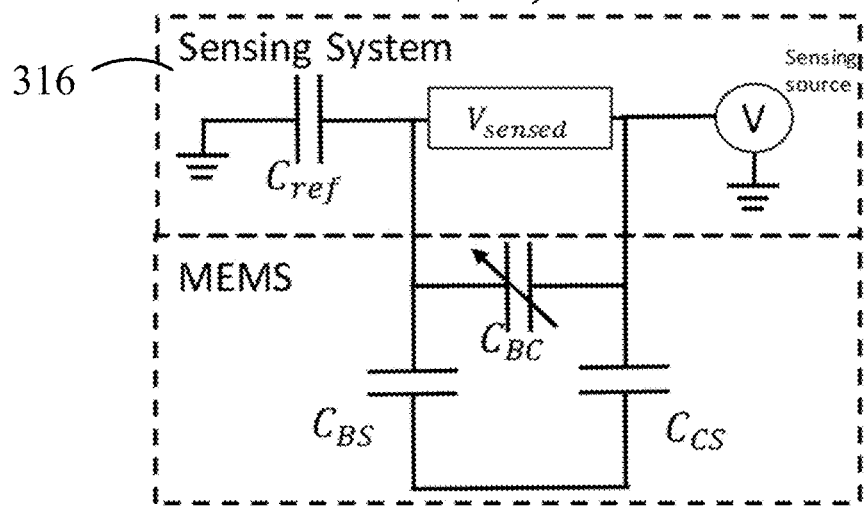
FIG. 5 is a diagram of the equivalent circuit of the structure of FIGS. 3 and 4.

FIG. 5 is a diagram of the equivalent circuit of the structure of FIGS. 3 and 4, showing the parasitic capacitance. Sensing system 316 is shown, with a sensing source V, a sensed voltage $V_{sensed}$ and a reference capacitance, $C_{ref}$. The sensed capacitance between the interleaved comb fingers is $C_{BC}$. The most significant parasitic capacitance is observed across the substrate, shown as $C_{BS}$ and $C_{CS}$. This parasitic capacitance $C_{BS}$ and $C_{CS}$ is coupled in parallel with the fingers capacitance $C_{BC}$, limiting the sensitivity of the sensed voltage ($\Delta V_{sensed}$). When the parasitic capacitance is large, corresponding to a low impedance ($\chi$), the change in the fingers capacitance has minimum effect on the sensed voltage. In other words, $$\frac{\delta V_{sensed}}{\delta \chi_{BC}}$$

is small when $\chi_{BS}+\chi_{CS} \ll \chi_{BC}$. Therefore, to increase sensitivity, the parasitic capacitance needs to be as small as possible. However, the substrate is a fundamental component in the MEMS mirrors and electrical decoupling is extremely difficult.

Additional Capacitance to Reduce Parasitic Capacitance Effect

FIG. 6 is a diagram of a first embodiment of a MEMS mirror with a parasitic capacitance reduction ring structure, according to certain embodiments. The structure is similar to that of FIG. 3, except that a ground (GND) terminal 602 is added, as a ring around the MEMS mirror structure. This ground terminal 602 provides an added capacitance as can be seen in the sectional view along lines A-A, shown in FIG. 7. FIG. 6 shows a range of dimensions. In general, the size of the mirror structure before adding the added capacitance with ground terminal 602 ranges from 1×1 mm up to 20×20 mm. Thus, the total dice size is around 20 to 30% bigger than the mirror area to provide room for the added capacitance. There is a tradeoff between the footprint (the smaller, the better) and the capacitance (the bigger, the better). Usually the footprint is dominated by the mirror size (from 1×1 mm to 20×20 mm with other possible combinations such as 12×18, etc.) and the width of the ring should be in the order of ~100-200 µm in one embodiment. This width is similar to the width of the anchor and bias terminal 314, and the anchor and COM terminal 310, both of which are in the range of 100-200 µm.

Figure 7A:
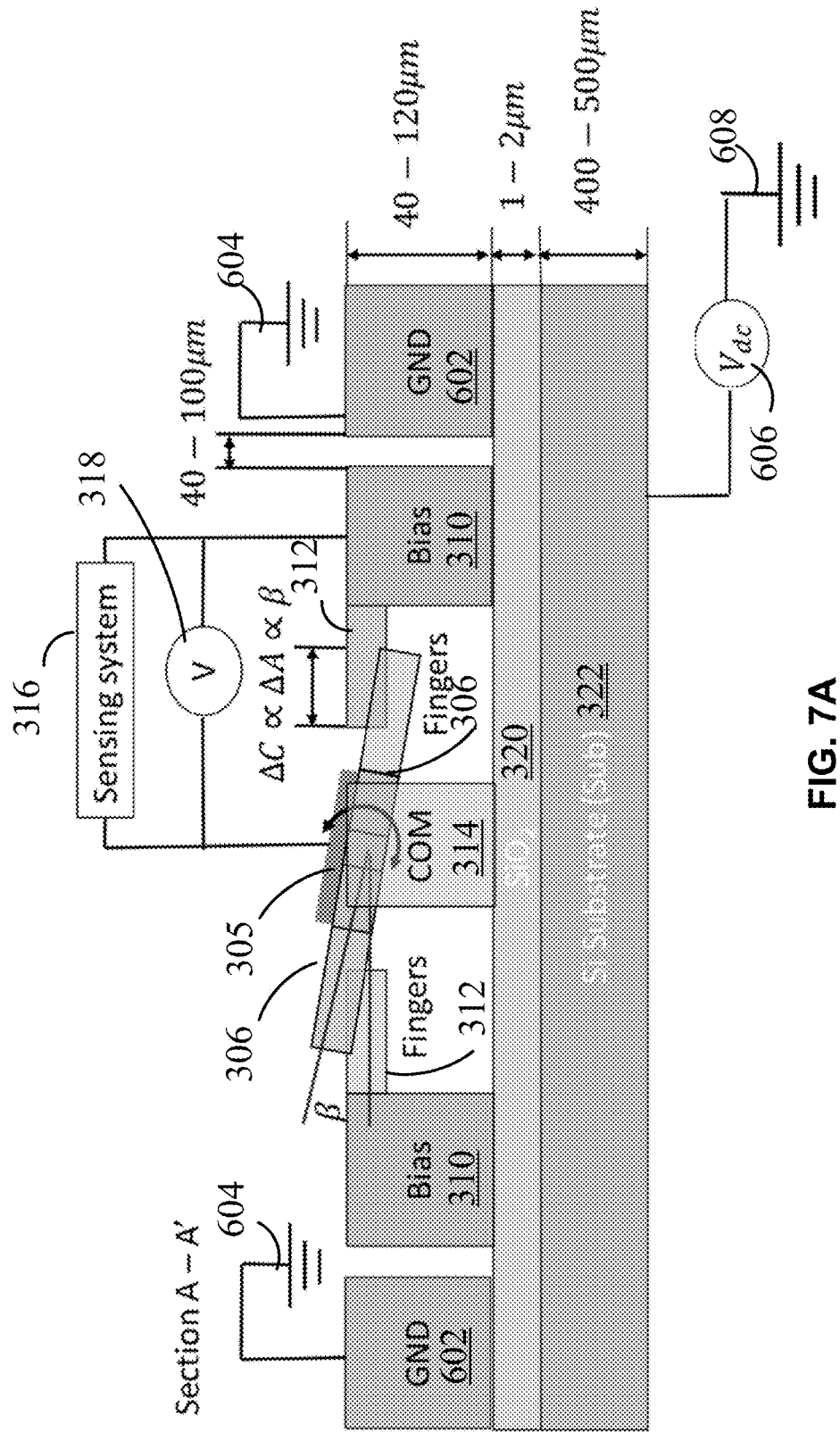
FIG. 7A is a sectional view of the structure of FIG. 6 along lines A-A, according to certain embodiments.

FIG. 7A is a sectional view of the structure of FIG. 6 along lines A-A, according to certain embodiments. From this view, a reflective layer 305 can be seen on mirror mass 306. The reflective layer can be aluminum or any other reflective material. Ground (GND) ring 602 provides an added capacitance between GND terminal 602 and Si substrate 322, with SiO$_2$ layer 320 as the dielectric. GND terminal 602 is connected to ground 604. The height of the GND terminal 602 in one embodiment is between 40-200 µm, similar to the height of COM terminal 310. GND terminal 602, and COM terminal 314 are etched from the same layer, and thus have the same height in one embodiment. The height of SiO$_2$ layer 320 is much thinner, at least 20 times thinner, between 1-2 µm. The substrate layer 322 is typically 400-500 µm. Usually, the MEMS are fabricated on SIO (silicon on insulator) wafers which are composed of a Si device layer (mass mirror is made with this layer and its thickness, in one embodiment, extends from 40 um to 200 um), oxide and Si handle layer or substrate. In one embodiment the Si layers are considered like metallic plates which have no effect on the capacitance. Thus, the capacitance depends on the oxide given by C=($\varepsilon$_r Area)/thickness, where $\varepsilon$_r is the relative permittivity and it is different for different oxides.

Substrate 322 is biased with a DC voltage 606 ($V_{dc}$) in one embodiment, connected to ground 608. In one embodiment, $V_{dc}$ can range between −200 to +200 mV. A connection to ground 608 is provided. The connection to $V_{dc}$ can be through a contact on the back side of the chip in one embodiment. In another embodiment, a via can be provided through the other layers, with a metal connection surrounded by an insulating layer to allow all the contacts to be made on the top of the chip. The contacts can be made by depositing metal pads, such as an aluminum (Au) coating for wire bonding.

The DC voltage 606 ($V_{dc}$) in the substrate will eliminate the dynamic capacitance of the Si substrate 322. As the mirror is driven with an AC voltage 318 up to 200 Vpp, some charge depletion can be observed at the substrate. The substrate capacitance varies when the driving voltage is applied due to the transition from charge depletion to charge accumulation, or vice versa, of the Si substrate. To avoid this transition and parasitic capacitance variation, a DC bias voltage is applied in the substrate to operate only in accumulation or depletion regimes. In theory, this power supply may act as ground for the substrate (assuming superposition) eliminating the DC noise. But in reality, the DC power supply has an output impedance making the substrate active again. An alternative embodiment simply grounds the substrate if the depletion problem is otherwise dealt with, or tolerated.

In one embodiment, an array of MEMS mirrors is used. The mirrors from the array are interconnected mechanically and electrically so they can be synchronized. All the connections are around the entire array; isolating each mirror affects the optical performance by reducing the fill factor.

Figure 7B:
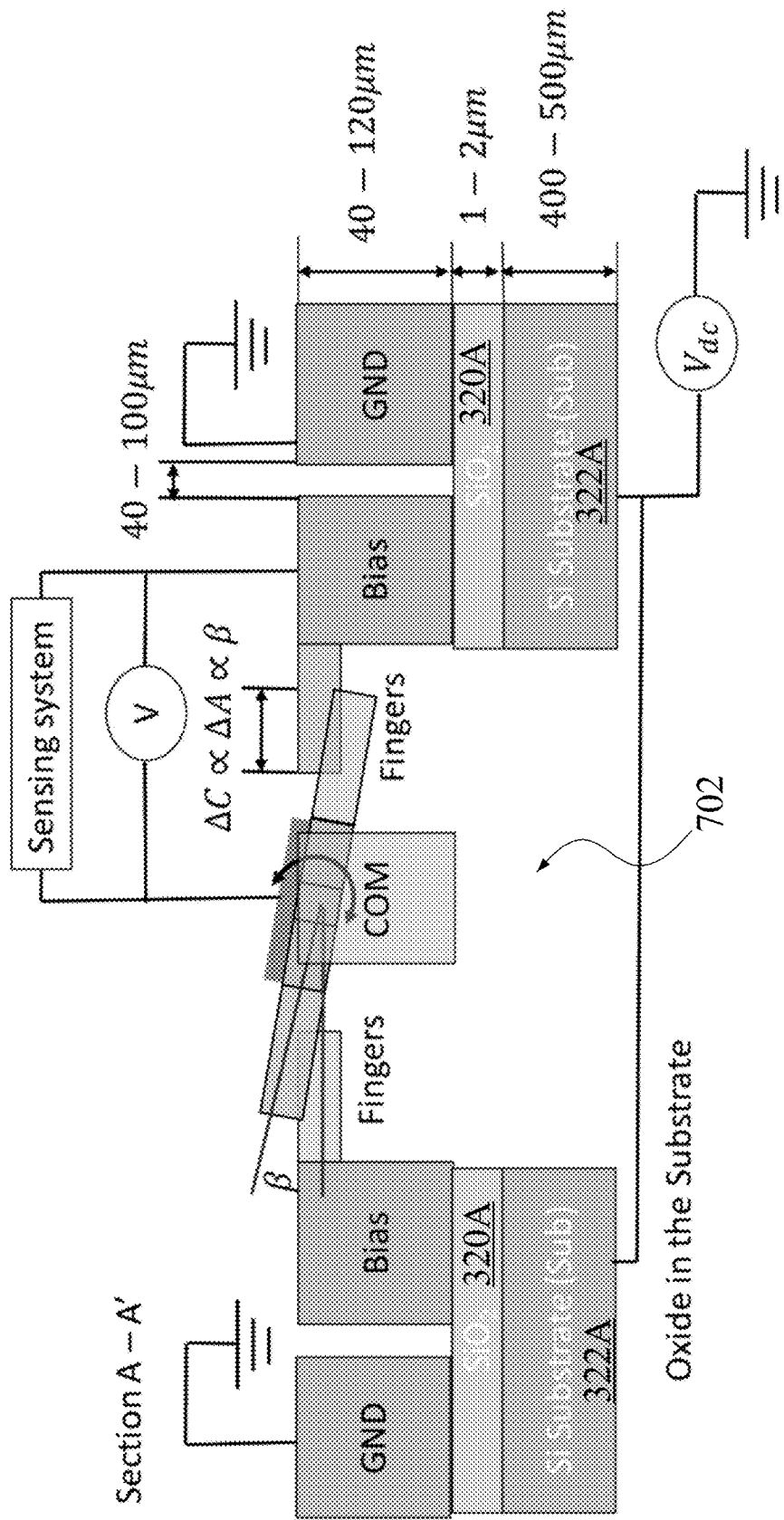
FIG. 7B shows an alternate embodiment to FIG. 7A, where the back side is open for an open cavity process.

FIG. 7B shows an alternate embodiment to FIG. 7A, where the back side is open for an open cavity process, where the ring configuration of FIG. 6 is used. Oxide layer 320A and substrate layer 322A are shown forming an open cavity 702.

FIG. 8 is a sectional diagram of a second embodiment of a MEMS mirror with a parasitic capacitance reduction substrate structure, according to certain embodiments. A capacitor is added to the bottom of the chip, using an oxide layer 702 and a metal layer 704. Metal layer 704 is connected to ground 706. Oxide layer 702 can be any number of oxides, such as $SiO_2$, $Al_2O_2$, etc. The thickness of the oxide layer 702 affects the total capacitance, but it may induce some undesired stress, thus the thickness is optimized accordingly in one embodiment. In various embodiments, a range of thickness values from 0.1 µm up to 2 µm is used, depending on the film and process.

As in FIG. 7, substrate 322 is biased with a DC voltage 708 ($V_{dc}$) in one embodiment, connected to ground 706. In order to maximize the amount of capacitance, the oxide layer 702 and metal layer 704 extend across the entire footprint of the MEMS mirror structure, to the edges of bias regions 310. In an alternate embodiment, they can extend further, such as to the edge of the chip where the MEMS mirror structure does not quite extend to the edge of the chip. Alternately, layers 702 and 704 can extend beyond just one (or more) borders of the MEMS mirror structure, such as shown extending to the right in FIG. 8, to both allow for a contact to DC voltage 708 and provide extra capacitor area.

The fabrication the bottom capacitor can be done by a number of methods, such as physical vapor deposition (PVD), e-beam deposition, thermal evaporation, DC/RF sputter deposition and/or reactive sputter deposition. The whole wafer, before dicing and after the MEMS mirrors process, is placed over a material source (metal and/or oxide). Both films can be deposited consecutively.

FIG. 9 is a diagram of a third embodiment of a MEMS mirror with a parasitic capacitance reduction parallel bar structure, according to certain embodiments. In this embodiment, instead of an anchor and ground terminal forming a ring, two parallel bars 920 are formed, with contact terminals 916 for connecting to ground. The rest of the structure is similar to the ring embodiment, with contact regions also shown. Similar contact regions can be added to the structures of FIGS. 6 and 8, providing a wider area for a contact. Also, the contact regions may be farther removed to the periphery of a chip.

FIG. 9 shows an electrostatic MEMS mirror structure 900 with springs 902, a mirror mass 904, and comb fingers 906, 912. The mirror mass 904 is suspended by mechanical springs 902 which are typically anchored in a $SiO_2$/silicon substrate 908 and anchored at anchor and COM terminals 910. Comb fingers 906 are connected to mirror mass 904, and are interleaved with comb fingers 912 connected to anchor and bias terminals 914. Terminals 910 provide for common (COM) with the mirror, both providing a driving voltage and sensing a change in capacitance between the fingers 906 connected to mirror mass 904, and interleaved fingers 912 connected to anchor and bias terminals 914. Anchor and bias terminals 914 are connected to a voltage bias, which is typically ground.

The structures of the figures herein are illustrative, and are not intended to be to scale, or limit the possible geometries. For example, the terminal pad rectangular areas 910, 914 and 916 could be farther from the MEMS mirror structure, and larger compared to the MEMS mirror structure than shown in the figures to allow room for wire-bonding.

As shown, this structure allows rotation around the axis of the springs 902. In another embodiment not shown in order to not complicate the diagram, additional springs can be provided to give a second, orthogonal axis of rotation of the mirror mass 904. Additional interleaved comb fingers are then provided, connected to separate COM and bias anchor terminals used. A similar two-axis structure can be provided for the other embodiments.

The mirror structure described above and in the figures is shown in certain embodiments, and other embodiments may be used. For example, the mirror mass may be oval instead of rectangular. Alternately, an oval reflective surface may be deposited on the mirror mass. Any number of other variations of the shapes of the mirror structure may be used.

In one alternate embodiment, the ring structure of FIGS. 6-7 and the bottom capacitance of FIG. 8 may be combined to give a larger capacitance while having the ring structure remain relatively narrow to limit the increase in the footprint of the chip. There is an external capacitor connected, C_ref in FIG. 10, and the value of this capacitor can be optimized as well to obtain maximum sensitivity.

Figure 10:
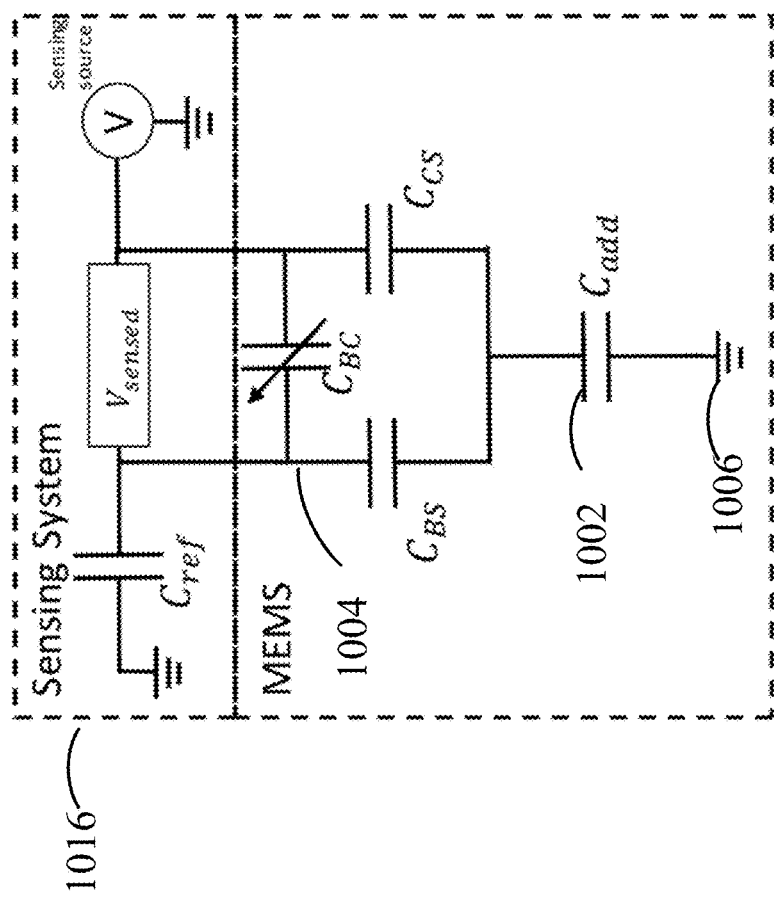
FIG. 10 is a diagram of the equivalent circuit of the structures of FIGS. 6, 8 and 9, according to certain embodiments.

FIG. 10 is a diagram of the equivalent circuit of the structures of FIGS. 6, 8 and 9, according to certain embodiments. Similar to FIG. 5, a sensing system 1016 is shown, with a sensing source V, a voltage sensed $V_{sensed}$ and a reference capacitance, $C_{ref}$ In one embodiment, sensing system 1016 uses a Wheatstone bridge circuit. The sensing voltage can be driving with a 1-10 MHz signal in one embodiment. The sensed capacitance between the interleaved comb fingers is $C_{BC}$. The most significant parasitic capacitance is observed across the substrate, shown as $C_{BS}$ and $C_{CS}$. This parasitic capacitance $C_{BS}$ and $C_{CS}$ is coupled in parallel with the fingers capacitance $C_{BC}$, limiting the sensitivity of the sensed voltage ($\Delta V_{sensed}$). When the parasitic capacitance is large, corresponding to a low impedance ($\chi$), the change in the fingers capacitance has minimum effect on the sensed voltage. In other words, $$\frac{\delta V_{sensed}}{\delta \chi_{BC}}$$

is small when $\chi_{BS}+\chi_{CS} \ll \chi_{BC}$. Therefore, to increase sensitivity, the parasitic capacitance needs to be as small as possible. This is accomplished with the added capacitor 1002, $C_{add}$. Capacitor 1002, $C_{add}$ corresponds to the capacitance formed by layers 602, 320 and 322 in FIG. 7, layers 322, 702 and 704 in FIG. 8, and layers 920, 908 and 918 in FIG. 9.

The sensing node is node 1004. The added capacitor 1002 shunts the parasitic capacitance to ground 1006, away from the sensing node. Ground 1006 is a grounding terminal for AC. Thus, this provides a leakage current to ground without any significant influence on the sensing node and thus the measured capacitance $C_{BC}$.

As shown in the equivalent circuit of FIG. 10, $$V_{sensed} = V_S \left( \frac{1}{\chi_{BC}} + \frac{\chi_{eq1}}{\chi_{BS}\chi_{CS}} \right) \left( \frac{\chi_{eq2}\chi_{BS}^2}{\chi_{BS}^2 - \chi_{eq1}\chi_{eq2}} \right), \text{ where } \chi_{eq1} =$$

$$\chi_{BS} \| \chi_{CS} \| \chi_{GND} \text{ and } \chi_{eq2} = \chi_{BC} \| \chi_{ref} \| \chi_{BS} \left( \chi = \frac{1}{i\omega C}, \text{ and } \omega = 2\pi f \right).$$

Figure 11:
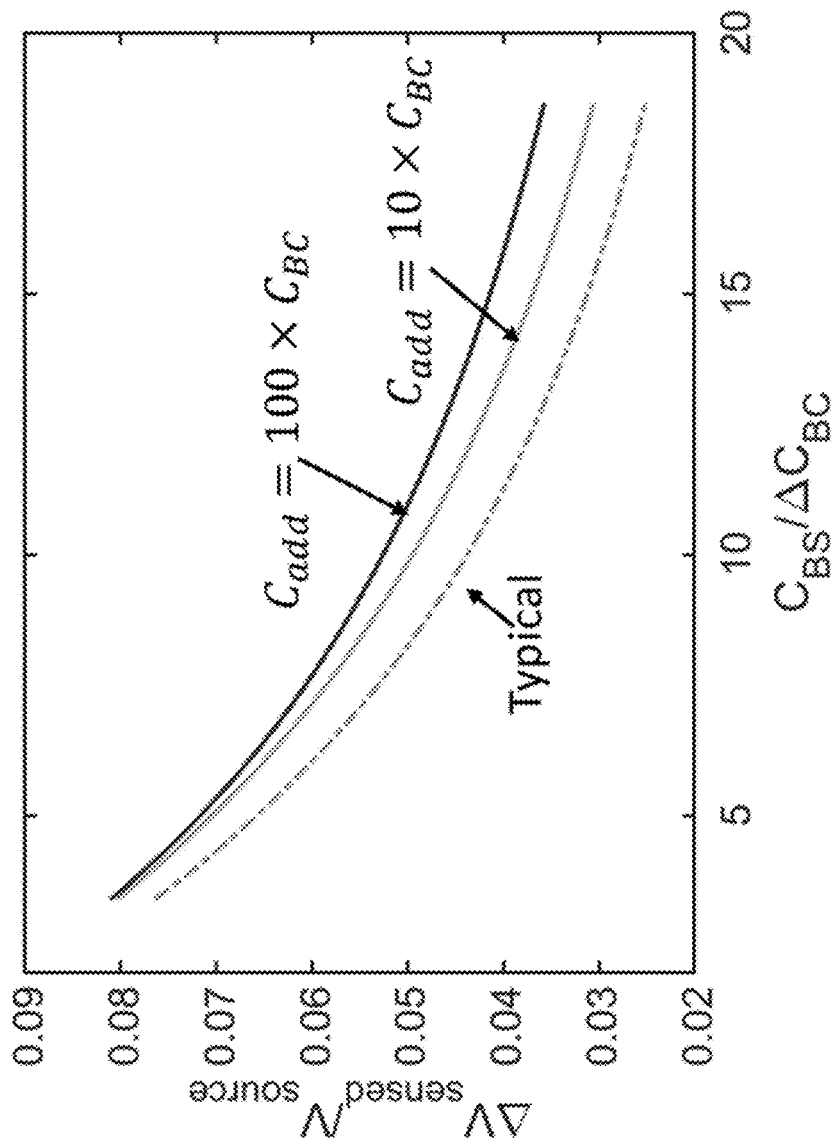
FIG. 11 is a graph comparing the sensed voltage sensitivity for the embodiment of FIG. 6 to a typical prior art structure.
Figure 12:
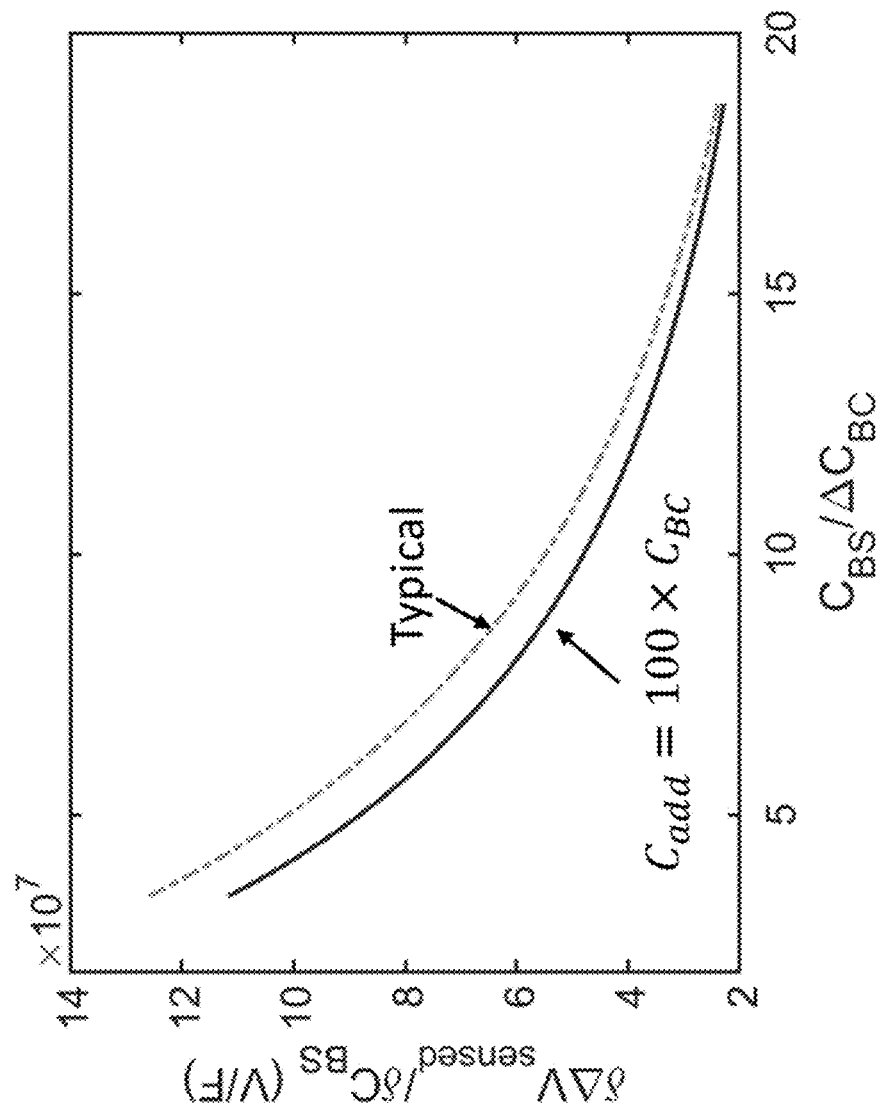
FIG. 12 is a graph comparing the sensed voltage noise reduction for the embodiment of FIG. 6 to a typical prior art structure.

FIG. 11 is a graph comparing the sensed voltage sensitivity for the embodiment of FIG. 6 to a typical prior art structure. Both FIGS. 11 and 12 are simulations based on a couple data points from the ring capacitance structure of FIG. 6. The plot of FIG. 11 compares the ΔV sensed (sensitivity) versus a typical prior art configuration. FIG. 11 shows the plot of the normalized voltage sensitivity, $$\frac{\Delta V_{sensed}}{V_{source}},$$

versus the parasitic capacitance ($C_{BS}$) over the fingers capacitance change ($\Delta C_{BC}$) for both an added capacitance of 100×$C_{BC}$ and 10×$C_{BC}$. As the parasitic capacitance is larger, the sensitivity is reduced for both cases. As can be seen, the configuration of the present invention shows an improvement of up to 20% with respect to the typical prior art configurations depending on the value of the added impedance, $\chi_{add}$, corresponding to the added capacitance.

FIG. 12 is a graph comparing the sensed voltage noise reduction for the embodiment of FIG. 6 to a typical prior art structure. The plot compares $$\frac{\delta \Delta V_{sensed}}{\delta C_{BS}}$$

(noise reduction) for the added capacitor versus a typical prior art configuration.

$$\frac{\delta \Delta V_{sensed}}{\delta \chi_{BS}}$$

corresponds to how sensitive the signal is to parasitic capacitance. As can be seen, this ratio is smaller than the typical prior art case as shown in the graph. This means that the new configuration of the present invention is less susceptible to noise in the case of variable parasitic capacitance.

Fabrication Process

The MEMS mirror structures are fabricated using semiconductor fabrication processes. A variety of processes can be utilized to achieve the structures of the present invention. For example, one process is as follows. The process starts with SOI wafers which consist of a Si/SiO2/Si stack (40-120 um/1-2 um/400-600 um). The backside is etched, followed by Au or reflective metal deposition and patterning. Next, the front Si and SiO2 layers are etched, forming the mirror structures. FIG. 7B shows an alternate embodiment where the back side is open for this open cavity process, where the ring configuration can be used. For a closed cavity, the front side Si of a cavity wafer is etched, then a second wafer is bonded and polished to a desired MEMS structure thickness forming a Si membrane. Then the reflective metals are deposited and patterned follow by Si etch forming the MEMS mirror structure.

Array of MEMS Mirrors

The MEMS mirror structures described herein may form part of a micro-mirror array. The micro-mirror array may include an array of micro-mirror assemblies, with each micro-mirror assembly comprising a micro-mirror and an actuator. In a micro-mirror assembly, a micro-mirror can be connected to a substrate via a connection structure (e.g., a torsion bar, a spring, etc.) to form a pivot, and the micro-mirror can be rotated around the pivot by the actuator. Each micro-mirror can be rotated by a rotation angle to reflect (and steer) light from a light source towards at a target direction. Each micro-mirror can be rotated by the actuator to provide a first range of angles of projection along a vertical axis and to provide a second range of angles of projection along a horizontal axis. The first range and the second range of angles of projection can define a two-dimensional field of view (FOV) in which light is to be projected to detect/scan an object. The FOV can also define the direction of incident lights, reflected by the object, that are to be detected by the receiver.

In some examples, a mirror assembly can include two arrays of rotatable mirrors to perform light steering along a first dimension (e.g., the x-axis) and a second dimension (e.g., the z-axis). In one embodiment, a MEMS mirror array comprises: an array of first rotatable mirrors to receive and reflect the light beam from the light source; a second rotatable mirror to receive the light beam reflected by the array of first rotatable mirrors; an array of first actuators configured to rotate each rotatable mirror of the array of first rotatable mirrors; and a second actuator configured to rotate the second rotatable mirror. The controller is configured to control the array of first actuators and the second actuator to rotate, respectively, the array of first rotatable mirrors and the second rotatable mirror to set a first angle of light path with respect to a first dimension and to set a second angle of the light path with respect to a second dimension orthogonal to the first dimension to perform at least one of: reflecting light from the light source along the light path, or reflecting input light propagating along the light path to the receiver. In some aspects, the light source is a laser diode.

Each micro-mirror will have its own, separate added capacitance in one embodiment. In another embodiment, for the added capacitance on the bottom of the chip shown in FIG. 8, the added capacitance may extend across the entire bottom, or a significant part, of a chip that includes multiple micro-mirrors. For a mirror array, in one embodiment each mirror has its own comb finger actuator and the total actuation capacitance is the summation of the capacitance for each mirror. The sensed capacitance is thus the total capacitance.

In one embodiment, an array of micro-mirrors is formed with each micro-mirror being a separate semiconductor chip. Several mirrors or a mirror array (one mirror array is one chip) are fabricated in one wafer, then the wafer is diced. Each individual device is then packaged.

In one embodiment, a micro-electromechanical system (MEMS) apparatus for beam steering in a Light Detection and Ranging (LiDAR) system of an autonomous vehicle is provided. The apparatus comprises the following elements:
   a mirror mass 304 having a reflective surface 305 and at least first and second respective sides;
   first and second supporting springs 302, wherein the first and second supporting springs have first ends, respectively, connected to the first and second respective sides of the mirror mass 304 on opposite sides to support the mirror mass;

first and second common terminals 310 connected to the first and second supporting springs 302, respectively, on second ends of the first and second supporting springs;

a plurality of first fingers 306 extending from the mirror mass on first and second sides orthogonal to the first and second supporting springs 302;

first and second bias terminals 314 opposite the first and second sides of the mirror mass 304;

a plurality of second fingers 312 extending from the first and second bias terminals, the plurality of second fingers being 312 interleaved with the plurality of first fingers 306 and partially overlapping the plurality of first fingers;

an oxide layer 320 below the first and second common terminals and the first and second bias terminals;

a substrate 322 below the oxide layer;

wherein there is a sensed capacitance (CBC) between the common terminals (C) and the anchor and bias terminals (B) proportional to the overlap between the plurality of first fingers and the plurality of second fingers;

wherein there is a first parasitic capacitance (CCS) between the common terminals and the substrate and a second parasitic capacitance (CBS) between the bias terminals and the substrate; and an added capacitance $C_{add}$ between the substrate 322 and a voltage source 606, wherein the added capacitance is a plurality of times larger than the first and second parasitic capacitance combined.

In one embodiment the added capacitance comprises a structure 602 outside the first and second common terminals and the first and second bias terminals, in the same layer as the first and second common terminals and the first and second bias terminals. In one embodiment, the structure comprises a rectangular ring 602 enclosing both the first and second common terminals and the first and second bias terminals.

In one embodiment, the added capacitance comprises:

a second oxide layer 702 on an opposite side of the substrate 322 from the first oxide layer 320;

a conductor layer 704 on a side of the second oxide layer 702 opposite the substrate 322; and a connection to ground 706 coupled to the conductor layer 704.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims. For instance, any of the examples, alternative examples, etc., and the concepts thereof may be applied to any other examples described and/or within the spirit and scope of the disclosure.

For example, instead of a rectangular mirror mass as shown in the figures, an oval or round mirror mass can be used. Such a mass can still have extending fingers. The adjoining bias terminal can be curved to match the oval shape, with corresponding extending fingers. Alternately, the bias terminal could be rectangular, and the extending fingers can be of different lengths, so that they overlap the same amount with equal length fingers of the bias terminal. Alternately, a different amount of overlaps can be provided for fingers of different lengths. There is no need to have the same amount of overlap, since it is the change in capacitance with tilt that is important, not the absolute amount of capacitance.

The MEMS mirror structure with the added capacitance of the present invention can be used in a variety of other applications than LIDAR. Light beam steering techniques can also be used in other optical systems, such as optical display systems (e.g., TVs), optical sensing systems, optical imaging systems, and the like. In various light beam steering systems, the light beam may be steered by, for example, a rotating platform driven by a motor, a multi-dimensional mechanical stage, a Galvo-controlled mirror, a resonant fiber, an array of microelectromechanical (MEMS) mirrors, or any combination thereof. A MEMS micro-mirror may be rotated around a pivot or connection point by, for example, a micro-motor, an electromagnetic actuator, an electrostatic actuator, or a piezoelectric actuator.

The MEMS mirror structure with the added capacitance of the present invention can have the mirror mass driven by different types of actuators. In some light steering systems, the transmitted or received light beam may be steered by an array of micro-mirrors. Each micro-mirror may rotate around a pivot or connection point to deflect light incident on the micro-mirror to desired directions. The performance of the micro-mirrors may directly affect the performance of the light steering system, such as the field of view (FOV), the quality of the point cloud, and the quality of the image generated using a light steering system. For example, to increase the detection range and the FOV of a LiDAR system, micro-mirrors with large rotation angles and large apertures may be used, which may cause an increase in the maximum displacement and the moment of inertia of the micro-mirrors. To achieve a high resolution, a device with a high resonant frequency may be used, which may be achieved using a rotating structure with a high stiffness. It may be difficult to achieve this desired performance using electrostatic actuated micro-mirrors because comb fingers used in an electrostatic-actuated micro-mirror may not be able to provide the force and moment needed and may disengage at large rotation angles, in particular, when the aperture of the micro-mirror is increased to improve the detection range. Some piezoelectric actuators may be used to achieve large displacements and large scanning angles due to their ability to provide a substantially larger drive force than electrostatic-actuated types, with a relatively lower voltage.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

What is claimed is:

1. A micro-electromechanical system (MEMS) apparatus comprising:
   a MEMS mirror structure having a rotatable mirror that produces a change in a measured capacitance corresponding to an angle of rotation;
   a driving voltage source coupled to the MEMS mirror structure;
   a first oxide layer below the MEMS mirror structure;
   a substrate below the first oxide layer;
   wherein there is a parasitic capacitance between the MEMS mirror structure and the substrate; and
   an added capacitor providing an added capacitance between the substrate and a voltage source, wherein the added capacitance is a plurality of times larger than the parasitic capacitance, the added capacitor including
      an added conductor around a perimeter of the MEMS mirror structure, the conductor being separated from the MEMS mirror structure, and
      a DC bias voltage source connected to the conductor.

2. The micro-electromechanical system (MEMS) apparatus of claim 1 further comprising:
   first and second supporting springs, wherein the first and second supporting springs have first ends, respectively, connected to first and second respective sides of the rotatable mirror, on opposite sides, to support the rotatable mirror;
   first and second common terminals connected to the first and second supporting springs, respectively, on second ends of the first and second supporting springs;
   a mirror mass;
   a plurality of first fingers extending from the mirror mass on first and second sides orthogonal to the first and second supporting springs;
   first and second bias terminals opposite the first and second sides of the mirror mass;
   a plurality of second fingers extending from the first and second bias terminals, the plurality of second fingers being interleaved with the plurality of first fingers and partially overlapping the plurality of first fingers;
   wherein the first oxide layer is below the first and second common terminals and the first and second bias terminals;
   wherein there is a sensed capacitance ($C_{BC}$) between the common terminals (C) and the bias terminals (B), with the sensed capacitance ($C_{BC}$) being proportional to the overlap between the plurality of first fingers and the plurality of second fingers;
   wherein the parasitic capacitance comprises a first parasitic capacitance ($C_{CS}$) between the common terminals and the substrate and a second parasitic capacitance ($C_{BS}$) between the bias terminals and the substrate.

3. The micro-electromechanical system (MEMS) apparatus of claim 2 wherein the added capacitance comprises a structure outside the first and second common terminals and the first and second bias terminals, in the same layer as the first and second common terminals and the first and second bias terminals.

4. The micro-electromechanical system (MEMS) apparatus of claim 2 further comprising:
   a second oxide layer on an opposite side of the substrate from the first oxide layer;
   a conductor layer on a side of the second oxide layer opposite the substrate; and
   a connection to ground coupled to the conductor layer;
   a via extending through the substrate and second oxide layer; and
   a conductive connector extending through the via to connect to the conductor layer to provide the connection to ground from a same side of the MEMS apparatus as the first and second bias terminals and the first and second common terminals.

5. The micro-electromechanical system (MEMS) apparatus of claim 4 wherein the second oxide layer and the conductor layer cover an area corresponding to the mirror mass, springs, fingers, first and second common terminals, and first and second bias terminals.

6. The micro-electromechanical system (MEMS) apparatus of claim 2 further comprising a driving voltage source connected between at least one of the first and second common terminals, and at least one of the first and second bias terminals.

7. The micro-electromechanical system (MEMS) apparatus of claim 6 further comprising a sensing system connected between at least one of the first and second common terminals, and at least one of the first and second bias terminals.

8. The micro-electromechanical system (MEMS) apparatus of claim 1 wherein the voltage source is ground.

9. The micro-electromechanical system (MEMS) apparatus of claim 1 wherein the added capacitance comprises a capacitor structure outside the MEMS mirror structure, in the same layer as the MEMS mirror structure.

10. The micro-electromechanical system (MEMS) apparatus of claim 9 wherein the capacitor structure comprises a rectangular ring enclosing the MEMS mirror structure.

11. The micro-electromechanical system (MEMS) apparatus of claim 10 wherein the rectangular ring is coupled to ground, and the substrate is coupled to a DC voltage source.

12. The micro-electromechanical system (MEMS) apparatus of claim 10 wherein the rectangular ring has a width between 100-200 μm.

13. The micro-electromechanical system (MEMS) apparatus of claim 1 wherein the added capacitor further comprises:
   a second oxide layer on an opposite side of the substrate from the first oxide layer;
   wherein the added conductor comprises a conductor layer on a side of the second oxide layer opposite the substrate;
   a connection to ground coupled to the conductor layer; and
   wherein the DC bias voltage source is connected to the substrate.

14. The micro-electromechanical system (MEMS) apparatus of claim 13 wherein the conductor layer extends across an entire footprint of the MEMS mirror structure.

15. The micro-electromechanical system (MEMS) apparatus of claim 1 further comprising:
   wherein the added conductor comprises a ring enclosing the MEMS mirror structure;
   a ground voltage source connected to the ring.

16. The micro-electromechanical system (MEMS) apparatus of claim 15 wherein the DC bias voltage source is connected to the substrate.

17. The micro-electromechanical system (MEMS) apparatus of claim 15 wherein the ring is rectangular.

* * * * *